United States Patent [19]

Aotani et al.

[11] 4,271,251

[45] Jun. 2, 1981

[54] PHOTOSENSITIVE COMPOSITIONS

[75] Inventors: Yoshimasa Aotani; Hiroshi Misu, both of Minami-ashigara; Akira Nagashima, Shizuoka, all of Japan

[73] Assignee: Fuji Photo Film Co., Ltd., Minami-ashigara, Japan

[21] Appl. No.: 86,622

[22] Filed: Oct. 19, 1979

[30] Foreign Application Priority Data

Oct. 19, 1978 [JP] Japan ............................. 53-128886

[51] Int. Cl.$^3$ .................... G03C 1/52; G03C 1/68
[52] U.S. Cl. .................................. 430/195; 430/191; 430/192; 430/193; 430/194; 430/292; 430/145; 430/281; 430/285; 430/286; 430/270; 430/908; 430/910; 430/343; 430/338; 430/344; 430/166; 430/167
[58] Field of Search ............. 430/338, 344, 343, 191, 430/166, 192, 167, 193, 194, 270, 195, 281, 286, 285, 908, 910, 292, 145

[56] References Cited

U.S. PATENT DOCUMENTS

| 2,610,120 | 9/1952 | Minsk et al. | 430/287 |
|---|---|---|---|
| 3,030,208 | 4/1962 | Schellenberg et al. | 430/235 |
| 3,042,515 | 7/1962 | Wainer | 430/344 |
| 3,282,693 | 11/1966 | Sagura et al. | 430/337 |
| 3,502,476 | 3/1970 | Itano et al. | 430/339 |
| 3,615,568 | 10/1971 | Jenkins | 430/332 |
| 3,674,745 | 7/1972 | Philpot et al. | 430/526 |
| 3,769,023 | 10/1973 | Lewis et al. | 430/282 |
| 3,929,489 | 12/1975 | Arcesi et al. | 430/281 |
| 3,987,037 | 10/1976 | Bonham et al. | 430/278 |
| 4,066,459 | 1/1978 | Bachman et al. | 430/394 |

FOREIGN PATENT DOCUMENTS

| 31-8495 | 8/1956 | Japan | 430/282 |
|---|---|---|---|
| 46-32714 | 9/1971 | Japan | 430/282 |
| 2010259 | 6/1979 | United Kingdom | 430/282 |

*Primary Examiner*—Won H. Louie, Jr.
*Attorney, Agent, or Firm*—Sughrue, Rothwell, Mion, Zinn and Macpeak

[57] ABSTRACT

A stabilized photosensitive composition comprising a leuco dye, a photooxidizing agent, and further a 2,4-dihydroxybenzaldoxime which is suitable for use in lithography, photoresists, etc., for obtaining visible contrast between the exposed and unexposed areas.

21 Claims, No Drawings

PHOTOSENSITIVE COMPOSITIONS

BACKGROUND OF THE INVENTION

1. Field of the Invention

This invention relates to a photosensitive composition and, more particularly, it relates to a stabilized photosensitive composition which when exposed to actinic radiation produces visible contrast between exposed and unexposed areas.

2. Description of the Prior Art

In many photographic applications such as, for example, lithography, photoresists, etc., it is preferred that after image-exposure, the exposed portions are visibly distinguishable from the unexposed portions. A particularly effective method for obtaining this effect is to incorporate various leuco compounds which are oxidized into the corresponding dyes using various organic polyhalogen compounds or photooxidizing agents (see, e.g., *Phot. Sci. Eng.*, 5, 98–104 (1961) and U.S. Pat. No. 3,042,515).

Since the composition comprising such a leuco dye and a photooxidizing agent discolors when it is exposed to air or oxygen, an antioxidant is incorporated into the composition. For example, U.S. Pat. No. 3,042,515 discloses a method for preventing discoloration of leuco dyes when they are exposed to air or oxygen in the presence of light and/or heat by the addition of an organic reducing agent having a hydroxy group on a benzene ring and also at least a hydroxy group or an amino group at another position of the benzene ring (e.g., hydroquinone, catechol, resorcinol, hydroxyhydroquinone, phlorglucinol, and aminophenols such as o-aminophenol and p-aminophenol). Also, U.S. Pat. No. 4,066,459 discloses that a stable printing out composition containing a leuco dye and a photooxidizing agent showing less discoloration during the storage thereof is obtained by adding thereto an antioxidant. However, even when these compositions are stored for a long period of time or under high temperature and high humidity conditions, they discolor and hence further improvement has been desired.

SUMMARY OF THE INVENTION

An object of this invention is, therefore, to provide a photosensitive composition containing a leuco dye and a photooxidizing agent having improved storage stability.

Another object of this invention is to provide a photosensitive composition containing a leuco dye and a photooxidizing agent, which shows substantially the same properties after storage for a long period of time under high temperature and high humidity conditions as before.

As a result of various investigations to achieve the above-described objects, it has been found that a stable photosensitive composition containing a leuco dye and a photooxidizing agent, which can be stably stored for a long period of time without causing discoloration and which can restrain the occurrence of a dark heat reaction during storage is obtained by adding 2,4-dihydroxybenzaldoxime to the photosensitive composition.

DETAILED DESCRIPTION OF THE INVENTION

The stabilizer, 2,4-dihydroxybenzaldoxime which is a characteristic component in the photosensitive composition of this invention has the following structure:

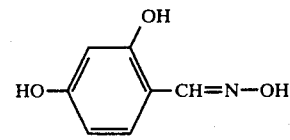

2,4-Dihydroxybenzaldoxime is a known compound described in, for example, *Anal. Chim. Acta.*, Vol. 13, p. 334. It is preferred that this stabilizer be used in an amount of from about 0.1% by weight to 25% by weight, most preferably from about 5% by weight to 20% by weight, based on the amount of the leuco dye.

Typical examples of the leuco dyes used in this invention are listed below, however, it will be understood by those skilled in the art that the teachings herein are intended to be applicable to leuco dyes in general and that the present invention is not limited to these leuco dyes alone.

Suitable leuco dyes include aminotriarylmethanes such as bis(p-dibutylaminophenyl)-[p-(2-cyanoethyl)-methylaminophenyl]methane, bis(p-dimethylaminophenyl)-2-quinolylmethane, tris(p-dimethylaminophenyl)methane (i.e., leuco crystal violet), tris(p-dipropylaminophenyl)methane, etc.; aminoxanthenes such as 3,6-bis(diethylamino)-9-phenylxanthene, 3-amino-6-dimethylamino-2-methyl-9-(o-chlorophenyl)xanthene, etc.; aminothioxanthenes such as 3,6-bis(diethylamino)-9-(o-ethoxycarbonylphenyl)thioxanthene, 3,6-bis(dimethylamino)thioxanthene, etc.; amino-9,10-dihydroacridines such as 3,6-bis(diethylamino)-9,10-dihydro-9-phenylacridine, 3,6-bis-(benzylamino)-9,10-dihydro-9-methylacridine, etc.; aminophenoxazine such as 3,7-bis(diethylamino)phenoxazine, etc.; aminophenothiazines such as 3,7-bis(ethylamino)phenothiazine, etc.; aminodihydrophenazines such as 3,7-bis(diethylamino)-5-hexyl-5,10-dihydrophenazine, etc.; aminophenylmethanes such as bis(p-dimethylaminophenyl)anilinomethane, etc.; leucoindamines such as 4-amino-4'-dimethylaminodiphenylamine, etc.; aminohydrocinnamic acids such as 4-amino-α,β-dicyanohydrocinnamic acid methyl ester, etc.; hydrazines such as 1-(2-naphthyl)-2-phenylhydrazine, etc.; amino-2,3-dihydroanthraquinones such as 1,4-bis(ethylamino)-2,3-dihydroanthraquinone, etc.; phenetylanilines such as N,N-diethyl-p-phenetylaniline, etc.; acyl derivatives of leuco dyes having basic NH group, such as 10-acetyl-3,7-bis(dimethylamino)phenothiazine, etc.; leuco like compounds which do not have a hydrogen atom capable of being oxidized but are oxidized into a colored compound, such as tris(4-diethylamino-o-tolyl)ethoxycarbonylmethane, etc.; leucoindigoid dyes; organic amines capable of being oxidized to colored forms, as described in U.S. Pat. Nos. 3,042,515 and 3,042,517. Typical examples of these compounds are 4,4'-ethylenediamine, diphenylamine, N,N-dimethylaniline, 4,4'-methylenediamine, triphenylamine, and N-vinylcarbazole. Preferred for use in the present invention are triphenylmethanes and xanthenes. Most preferred leuco dyes are tris(p-dimethylaminophenyl)methane, tris(p-diethylaminophenyl)methane, tris(p-dipropylaminophenyl)methane, and 3,6-bis(diethylamino)-9-phenylxanthene.

Most conventional photooxidizing agents can be used in the present invention. A preferred photooxidizing agent is inactive until it is exposed to actinic radiation such as visible light, ultraviolet radiation, infrared radiation, X-rays, etc. Each photooxidizing agent has a different peak sensitivity over the entire spectral region according to the structure of the compound, and, therefore, the specific photooxidizing agent selected is dependent on the actinic radiation used. When the photooxidizing agent is exposed to such actinic radiation, it forms an oxidizing agent which oxidizes the leuco dye to the colored form.

Typical examples of the photooxidizing agent are the halogen hydrocarbons such as carbon tetrabromide, N-bromosuccinimide, tribromomethylphenylsulfone, etc., described in U.S. Pat. Nos. 3,042,515 and 3,502,476; the azide polymers described in *The Lecture Summary*, p. 55 for the Spring Meeting of the Society of Photographic Science and Technology of Japan, 1968; the azide compounds such as 2-azidobenzoxazole, benzoylazide, 2-azidobenzimidazole, etc., described in U.S. Pat. No. 3,282,693; and the compounds such as 3'-ethyl-1-methoxy-2-pyridothiacyanine perchlorate, 1-methoxy-2-methylpyridinium p-toluenesulfonate, etc., described in U.S. Pat. No. 3,615,568, although the photooxidizing agents used in this invention are not limited to these compounds. The photooxidizing agents which are most preferred for use in the present invention include vinyl halomethyl-S-triazines such as 2,4-bis(trichloromethyl)-6-(p-methoxystyryl)-S-triazine as described in U.S. Pat. No. 3,987,037; 2-halomethyl-5-vinyl-1,3,4-oxaziazoles such as 2-trichloromethyl-5-(p-methoxystyryl)-1,3,4-oxaziazole and 2-trichloromethyl-5-(p-butoxystyryl)-1,3,4-oxaziazole as described in British Pat. No. 2,010,259 A; carbon tetrabromide; 2-azidobenzimidazole; 2-azidobenzoxazole; naphthoquinone-(1,2)-diazide (2)-4-sulfonyl chloride, etc.

When the composition of the present invention is uniformly coated on a suitable support and dried, a binder is often necessary to form the uniform coating and to improve adhesion of the coating and the support. Suitable binders for the composition include synthetic polymers such as acrylic acid resins, styrene resins, polyamides, polyesters, polyurethanes, polyvinyl alcohol, etc.; the modified products of synthetic polymers such as polyvinyl formal, polyvinyl butyral, etc.; and natural polymers and the modified products thereof such as cellulose, gelatin, etc., although it will be readily understood that the binders used in this invention are not limited to these materials. When paper or cloth is used as a support, the photosensitive composition of the present invention can be used without a binder.

When the photosensitive composition is used as a photoresist composition for preparing an etching resist or for preparing a printing plate, the photosensitive composition should contain a photohardening component. The photohardening component which may be added to the composition acts as a binder, i.e., is a material which acts to adhere a mixture of the leuco dye and the photooxidizing agent to a support, and is used to form a polymer image upon development. Typical photohardening components suitable for use in the photosensitive composition of this invention are as follows:

Polyvinyl cinnamate described in U.S. Pat. No. 2,610,120; the polyester having a photosensitive group in the main chain described in U.S. Pat. No. 3,030,208 i.e., where the polyester has a photosensitive group in the main chain and is a polyester of a polyhydric alcohol and a polycarboxylic acid, said polyester being soluble in an organic solvent and containing, as an essential recurring integral portion, a

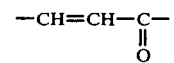

grouping, said grouping being attached through the —CH=CH— end to an aromatic nucleus and through the

end to a member selected from the group consisting of aromatic nuclei, o-alkylene radicals and amido nitrogen; the azide polymers (which also act as photooxidizing agents) described in *The Lecture Summary*, p. 55 in the Spring Meeting of the Society of Photographic Science and Technology of Japan, 1968; the polymers having a cinnamylidene-malonic acid repeating unit described in U.S. Pat. No. 3,674,745; and the photocrosslinking type polymers described in U.S. Pat. No. 3,929,489, etc. Furthermore, there are the photopolymerizable composition comprising an ethylenically unsaturated compound, an initiator, and a binder described in Japanese Patent Publication No. 8495/60; the photopolymerizable composition comprising an unsaturated polyester, a crosslinking agent, and an optical sensitizer described in Japanese Patent Publication No. 19125/68; and the photopolymerizable composition comprising an ethylenically unsaturated compound, an initiator, a polymer having a free acid group in the side chain, and a protective layer described in Japanese Patent Publication No. 32714/71.

The photohardening component is preferably used in an amount of about 1 to 1,000 parts by weight, most preferably about 10 to 200 parts by weight, per 1 part by weight of the leuco dye when it is used.

An inert solvent for the leuco dye, the stabilizer, the photooxidizing agent, the binder and/or the photohardening component is ordinarily used for dissolving these components. A liquid photosensitive composition prepared by mixing these components using the solvent is conveniently and easily coated on a support. The solvents used for forming the photosensitive composition of this invention include amides such as formamide, N,N-dimethylformamide, N,N-dimethylacetamide, etc.; alcohols such as methanol, ethanol, 1-propanol, 2-propanol, butanol, etc.; ketones such as acetone, 2-butane, cyclohexanone, etc.; esters such as ethyl acetate, ethyl benzoate, etc.; ethers such as tetrahydrofuran, dioxane, etc.; chlorinated aliphatic hydrocarbons such as methylene chloride, ethylene chloride, dichloroethane, etc.; aromatic hydrocarbons such as benzene, toluene, etc.; other general solvents such as dimethylsulfoxide, o-dichlorobenzene, dicyanocyclobutane, 1-methyl-2-oxohexamethyleneimide, etc.; or a mixture of these solvents.

Upon preparation of the photosensitive composition of this invention, good results are obtained by mixing the leuco dye and the photooxidizing agent in a ratio by weight of about 10:1 to 1:10, preferably about 2:1 to 1:2. The proportion of the binder, when present, is from about 0.5 to about 100 parts by weight per 1 part by weight of the sum of the leuco dye and the photooxidizing agent.

A photosensitive element can be prepared using such a leuco dye, photooxidizing agent and a binder and/or a photohardening component in an ordinary method. For example, by blending a dispersion or solution of the color-forming agent and the photooxidizing agent with a binder and/or a photohardening agent to form a photosensitive composition and coating or impregnating a support with the photosensitive composition, or forming a self-supporting layer of the photosensitive composition. The dry thickness of the coating of the photosensitive composition of this invention is from about 0.05 micron to 10 microns and preferably about 0.1 to 5.0 microns for lithographic printing plate, however, those skilled in the art will appreciate that thicknesses outside this range may be used.

The photosensitive composition is applied to the support by spray coating, brush coating, roller coating, dip coating, etc., or the support may be impregnated with the composition by immersing it in the solution of the composition. The element thus prepared is dried at room temperature under vacuum or by heating.

The photosensitive element is then exposed to a pattern of active radiation to form images directly on the element. The image exposure is performed by contact printing, projection (enlargement) using lenses, reflection, double reflection, etc., using an image bearing transparency.

Suitable support materials for use in this invention can be selected from various materials which do not chemically react with the coated composition and which are not deformed by exposure or development. Examples of such supports are fiber-based materials such as papers, polyethylene coated papers, polypropylene coated papers, parchment, cloth, etc.; sheets or foils of metals such as aluminum, copper, magnesium, zinc, etc.; glass sheets or glass sheets coated or vapor deposited with chromium, a chromium alloy, steel, silver, gold, platinum, etc.; and synthetic resin or polymer films such as poly(alkyl acrylates) (e.g., poly(methyl methacrylate), etc.), polyester (e.g., polyethylene terephthalate, polyvinyl acetal, etc.), polyamides (e.g., nylon, etc.), and cellulose esters (e.g., cellulose nitrate, cellulose acetate, cellulose acetate-propionate, cellulose acetate-butyrate, etc.

As supports useful for making printing plates, in particular lithographic printing plates, there are a zinc plate, an aluminum plate subjected to electrolytic treatment, a grained aluminum plate, a copper plate, or a paper, a surface-hydrolyzed cellulose ester film, a polyolefin film, a polyester film, a polyamide film, etc.

Such a support may be under-coated with a copolymer of vinylidene chloride and an acrylic acid monomer (e.g., acrylonitrile, methyl acrylate, etc.), a copolymer of vinylidene chloride and an unsaturated dicarboxylic acid (e.g., itaconic acid, etc.), carboxymethyl cellulose, gelatin, polyacrylamide, or the like prior to coating the photosensitive composition.

The support may have a filter layer on an antihalation layer composed of a colored polymer layer which absorbs the radiation for exposure after passing through the radiation sensitive layer or preventing undesirable reflection of the radiation from the support.

Of the polymers described above the polymer containing a yellow dye is particularly effective as an antihalation layer when ultraviolet radiation is used for exposure.

When the photosensitive composition contains a photohardening component, after exposing to a radiation, the photosensitive element may be developed by flushing, soaking, swabbing, etc., using a solution which selectively dissolves the unexposed portions of the radiation sensitive layer (hereinafter referred to as developer). Typical examples of such a developer is a uniform solution comprising (a) water, (b) an organic solvent which can dissolve or swell the photosensitive layer and has a solubility in water of lower than 10% by weight at 20° C. and/or (c) a solubilizing agent as described in Japanese Patent Application (OPI) No. 88603/74 (The term "OPI" as used herein refers to a "published unexamined Japanese patent application").

Practical examples of the above-mentioned organic solvent (b) are carboxylic acid esters such as ethyl acetate, benzyl acetate, butyl acetate, amyl acetate, propyl acetate, ethyleneglycol monobutyl acetate, butyl lactate, butyl levulinate, etc.; ketones such as ethyl butyl ketone, methyl isobutyl ketone, cyclohexanone, etc.; alcohols such as benzyl alcohol, etc.; alkyl-substituted aromatic hydrocarbons such as xylene, etc.; and halogenated hydrocarbons such as methylene dichloride, ethylene dichloride, monochlorobenzene, etc. As to the ratio of water (a) and the component (b), it is preferred that the proportion of the component (b) be from about 1% by weight to about 20% by weight to the total amount of the developer although the proportion may be properly adjusted over a wide range.

The developer is essentially composed of water and the above-mentioned component (b) but the developer may further contain, if component (b) will not dissolve, a solubilizing agent. The solubilizing agent is a component which acts, when the solubility of the above-mentioned organic solvent in water is comparatively low and gives nonuniform solution, to dissolve effectively the organic solvent in water and make a uniform developer. The dissolution of an excessive amount of organic solvent which cannot be dissolved in water itself but is uniformly dissolved in water using the solubilizing agent is called "solubilization". As such a solubilizing agent, a surface active agent and/or a "solubilizable" organic compound other than the above-described component (b) (hereinafter referred to "auxiliary organic solvent") are used. The most preferred surface active agent is one having a function as solubilizing agent, capable of increasing the permeability of the developer, and having a function of increasing the development speed. The surface active agents having such preferred functions are anionic surface active agents and nonionic surface active agents. Examples of the anionic surface active agents are aliphatic salts, high alcohol sulfuric acid ester salts, aliphatic alcohol phosphoric acid ester salts, sulfonic acid salts of dibasic fatty acid esters, fatty acid amide sulfonates, alkylarylsulfonates, formaldehyde condensed naphthalenesulfonates, etc.

Examples of the nonionic surface active agents are polyoxyethylene alkyl ethers, polyoxyethylene alkylphenol ethers, polyoxyethylene alkyl esters, sorbitan alkyl esters, polyoxypropylene polyoxyethylene ethers, etc.

These surface active agents may be used in combinations of two or more. Also, there is no particular limitation about the amount of these agents but a preferred amount of the surface active agent is less than 10% by weight based on the total amount of the developer.

On the other hand, any auxiliary organic solvents which differ from the above-described component (b) and promote the dissolution of the component (b) in water can be used as the stabilizing agent. Examples of such an auxiliary organic solvent are alcohols such as methanol, ethanol, propanol, butanol, etc.; ketones such as acetone, methyl ethyl ketone, etc.; carboxylic acids such as lactic acid, levulinic acid, etc.; lower alkyl esters of carboxylic acids such as methyl lactate, ethyl lactate, methyl levulinate, ethyl levulinate, etc.; ethyleneglycol monomethyl ether; ethyleneglycol monoethyl ether; ethyleneglycol monomethyl ether acetate; ethyleneglycol monoethyl ether acetate; alkoxy alcohols such as methoxy butanol, ethoxy butanol, etc.; and methoxy butanol acetate. There is no particular limitation on the amount of these auxiliary organic solvents but the amount is preferably less than about 15% by weight based on the total amount of the developer.

In addition to the above-described typical examples of the developers, the developer containing an oxyacid (e.g., lactic acid) or a keto-acid (e.g., levulinic acid) described in Japanese Patent Application (OPI) No. 138901/75, the developer containing lactam described in Japanese Patent Application (OPI) No. 59504/76, the developer comprising an alkaline aqueous solution containing 2 to 50% by weight of an organic solvent described in German Pat. No. 1,622,297, etc., may be also used although the developer used in this invention is not limited to these developers.

The developer used in this invention may further contain other additives if necessary. For example, the developer may contain a dye and/or a pigment. When the developer is used for developing a lithographic printing plate, an antiscumming agent and/or a turbidity preventing agent may be added to the developer.

The photosensitive element is then processed by a desired known method according to the uses thereof. For example, a printing plate may be subjected to an etching treatment for being desensitized. When a developed radiation sensitive layer forms a photoresist layer, the photosensitive element having the radiation sensitive layer is typically processed by an acidic or basic etching solution and then processed in a plating bath.

The invention will now be described by reference to the following examples.

EXAMPLE 1

(a) A photosensitive composition consisting of the following components was prepared:

| | |
|---|---|
| Photosensitive polyester (mean molecular weight of about 8,000) prepared by the condensation of diethyl p-phenylene diacrylate and 1,4-di-β-hydroxyethoxy-cyclohexane | 20.0 g |
| 2-(Benzoylmethylidene)-3-methylnaphtho-[1,2-d]thiazoline | 1.2 g |
| Dioctyl Phthalate | 4.0 g |
| Leuco Crystal Violet | 0.4 g |
| 2,4-Di(trichloromethyl)-6-(p-methoxy-styryl)-s-triazine | 0.2 g |
| Dichloroethane | 200 ml |
| Monochlorobenzene | 400 ml |

When the above-described composition was allowed to stand, it began to discolor. Then, 2.0 mg of 2,4-dihydroxybenzaldoxime was added to 30 ml of the above-described composition. The same procedure as above was repeated 14 times while using 2.0 mg of the following conventional antioxidants in place of 2.0 mg of 2,4-dihydroxybenzaldoxime.

(1) Hydroquinone (described in U.S. Pat. No. 3,042,515)
(2) Erysorbic acid
(3) p-Aminophenol (described in U.S. Pat. No. 3,042,515)
(4) 2,6-Di-t-butyl-p-cresol
(5) Urea
(6) Thiourea
(7) Triphenyl phosphate
(8) Resorcinol (described in U.S. Pat. No. 3,042,515)
(9) m-Aminophenol (described in U.S. Pat. No. 3,042,515)
(10) Morpholinohexosereductone
(11) L-Ascorbic acid
(12) 2,5-Bis(1,1,3,3-tetramethylbutyl)hydroquinone
(13) 7,7'-Dimethyl-6,6'-dihydroxy-4,4,4',4'-tetramethyl-bis-2,2'-spirochroman
(14) p-t-Butylcatechol Each of the 16 above-described photosensitive compositions (including one containing no antioxidant) was coated on an aluminum support, which has been subjected to an electrolytic treatment, by rotary coating at a rotation speed of 200 rpm. Each of the photosensitive plates thus prepared was aged at a relative humidity of 75% and a temperature of 45° C. and the change in density (support+fog) was measured with the passage of time, the results are shown in the following table, in which the density shown is reflection density.

| Additive | Density Change (support + fog) | | |
|---|---|---|---|
| | 0 Hr | 72 Hrs | 168 Hrs |
| None | 0.33 | 0.47 | 0.53 |
| 2,4-Dihydroxybenzaldoxime | 0.33 | 0.34 | 0.35 |
| Compound (1) | 0.32 | 0.49 | 0.56 |
| Compound (2) | 0.33 | 0.49 | 0.56 |
| Compound (3) | 0.32 | 0.50 | 0.57 |
| Compound (4) | 0.33 | 0.45 | 0.53 |
| Compound (5) | 0.33 | 0.47 | 0.53 |
| Compound (6) | 0.34 | 0.47 | 0.53 |
| Compound (7) | 0.32 | 0.49 | 0.54 |
| Compound (8) | 0.33 | 0.48 | 0.53 |
| Compound (9) | 0.32 | 0.48 | 0.55 |
| Compound (10) | 0.32 | 0.42 | 0.48 |
| Compound (11) | 0.34 | 0.49 | 0.54 |
| Compound (12) | 0.32 | 0.49 | 0.54 |
| Compound (13) | 0.33 | 0.51 | 0.59 |
| Compound (14) | 0.33 | 0.48 | 0.54 |

(b) The experiment (a) was repeated 7 times while, however, 2.0 mg of the following antioxidants described in U.S. Pat. No. 4,066,459 was used in place of the antioxidant used in (a).

(15) Salicylaldoxime
(16) Dimethylglyoxime
(17) N,N'-Bis(salicylidene)-1,2-ethylenediamine
(18) N,N'-Bis(salicylidene)-1,3-propanediamine
(19) 1,2-Bis(2,4-dihydroxybenzal)ethylenediamine
(20) 1,3-Bis(2,4-dihydroxybenzal)-1,3-propanediamine
(21) Salicylaldazine Each of the 9 above-described photosensitive compositions (including a control photosensitive composition containing no antioxidant and a photosensitive composition of this invention containing 2,4-dihydroxybenzaldoxime) was coated on an aluminum support, which had been subjected to an electrolytic treatment by rotary coating at a rotation speed of 200 rpm. Each of the photosensitive plates thus prepared was aged for 3 days (72 hours) under a relative humidity of 75% and a temperature of 50° C. and the change of the density (support+fog) was measured, the results are shown in the following table. In the table, the density shown is reflection density.

| Additive | Density of Unexposed Portion (support + fog) | |
|---|---|---|
| | Fresh | After 72 Hrs |
| None | 0.33 | 0.48 |
| 2,4-Dihydroxybenzaldoxime | 0.33 | 0.35 |
| Compound (15) | 0.33 | 0.49 |
| Compound (16) | 0.33 | 0.50 |
| Compound (17) | 0.33 | 0.49 |
| Compound (18) | 0.33 | 0.49 |
| Compound (19) | 0.33 | 0.51 |
| Compound (20) | 0.33 | 0.50 |
| Compound (21) | 0.32 | 0.52 |

From the results described above, it will be understood that the photosensitive compositions of this invention have very excellent stability with time as compared to conventional ones. This is, 2,4-dihydroxybenzaldoxime which is used as a stabilizer or antioxidant in this invention has an excellent stabilizing action as compared to conventional stabilizers or antioxidants.

EXAMPLE 2

A photosensitive composition consisting of the following components was prepared:

| | |
|---|---|
| Copolymer (10:1) of Poly(methyl methacrylate-methacrylic acid) | 1.0 g |
| Trimethylolpropane Triacrylate | 0.5 g |
| 2-Trichloromethyl-4-(p-methoxystyryl)-1,3,5-oxadiazole | 0.02 g |
| 2-Benzoylmethylene-3-methyl-$\beta$-naphthothiazoline | 0.02 g |
| Leucocrystal Violet | 0.02 g |
| Toluene | 10 ml |

To 5 ml of the above-described photosensitive composition was added 2 mg of 2,4-dihydroxybenzaldoxime. Each of the photosensitive composition containing 2,4-dihydroxybenzaldoxime and a photosensitive composition containing no 2,4-dihydroxybenzaldoxime was coated on an aluminum support by rotary coating at a rotation speed of 200 rpm. Each of the photosensitive plates thus prepared was aged under the conditions of a relative humidity of 75% and a temperature of 45° C. for 72 hours and the change in density with the passage of time was measured. The results are shown in the following table in which the density shown is reflection density.

| Additive | Density of Unexposed Portions (support + fog) | |
|---|---|---|
| | Fresh | After 72 Hrs |
| None | 0.33 | 0.49 |
| 2,4-Dihydroxybenzaldoxime | 0.33 | 0.35 |

From the results, it will be understood that the photosensitive composition of this invention had excellent stability in time passage.

EXAMPLE 3

A photosensitive composition consisting of the following components was prepared:

| | |
|---|---|
| 10% Benzene Solution of Polystyrene | 10 ml |
| Leucocrystal Violet | 200 mg |
| 4-Ethylpyridine-N-oxide | 60 mg |
| 4-(p-Dimethylaminostyryl)quinoline | 100 mg |
| Carbon Tetrabromide | 2.8 g |

To 5 ml of the above-described photosensitive composition was added 4 mg of 2,4-dihydroxybenzaldoxime. Each of the photosensitive composition containing 2,4-dihydroxybenzaldoxime and a photosensitive composition containing no 2,4-dihydroxybenzaldoxime was coated on a polyethylene terephthalate film by rotary coating at a rotation speed of 200 rpm. Each of the photosensitive plates thus prepared was aged for 72 hours at a relative humidity of 75% and a temperature of 45° C. and the change in density was measured, the results are shown in the following table, in which the density is shown by absorbance.

| Additive | Density of Unexposed Portions (support + fog) | |
|---|---|---|
| | Fresh | After 72 Hrs |
| None | 0.11 | 0.34 |
| 2,4-Dihydroxybenzaldoxime | 0.11 | 0.14 |

While the invention has been described in detail and with reference to specific embodiments thereof, it will be apparent to one skilled in the art that various changes and modifications can be made therein without departing from the spirit and scope thereof.

What is claimed is:

1. In a photosensitive composition comprising a leuco dye and a photooxidizing agent forming an oxidizing agent capable of oxidizing the leuco dye upon exposure of said composition to radiation, the improvement wherein the composition additionally contains 2,4-dihydroxybenzaldoxime in an amount sufficient to restrain the occurrence of a dark heat reaction during storage of said composition.

2. The photosensitive composition of claim 1, wherein said 2,4-dihydroxybenzaldoxime is present in an amount of about 0.1 to 25% by weight based on the amount of the leuco dye.

3. The photosensitive composition of claim 1 further comprising a binder.

4. The photosensitive composition of claim 1, which further comprises a photohardening agent suitable for preparing a photoresist composition used in preparing an etching resist or for preparing a printing plate.

5. The photosensitive composition of claim 1, wherein the weight ratio of said dye to said photooxidizing agent is about 10:1 to 1:10.

6. The photosensitive composition of claim 3, wherein said binder is present in an amount of about 0.5 to 100 parts by weight per 1 part by weight of the sum of leuco dye and photooxidizing agent.

7. The photosensitive composition of claim 4, wherein said photohardening agent is present in an amount of about 1 to 1,000 parts by weight per part by weight leuco dye.

8. In a photosensitive element comprising a support having coated thereon a layer of a photosensitive composition containing an leuco dye and a photooxidizing agent forming an oxidizing agent capable of oxidizing the leuco dye upon exposure of said composition to radiation, the improvement wherein said composition further contains 2,4-dihydroxybenzaldoxime in an amount sufficient to restrain the occurrence of a dark heat reaction during storage of said composition.

9. The photosensitive element of claim 8, wherein said 2,4-dihydroxybenzaldoxime is present in said composition in an amount of about 0.1 to 25% by weight based on the amount of leuco dye in the composition.

10. The photosensitive element of claim 8, wherein said photosensitive composition additionally contains a binder.

11. The photosensitive element of claim 8, wherein said photosensitive composition additionally contains a photohardening agent suitable for preparing a photoresist composition used in preparing an etching resist or for preparing a printing plate.

12. The photosensitive element of claim 8, wherein the weight ratio of said dye to said photooxidizing agent is about 10:1 to 1:10.

13. The photosensitive element of claim 10, wherein said binder is present in an amount of about 0.5 to 100 parts by weight per 1 part by weight of the sum of leuco dye and photooxidizing agent.

14. The photosensitive element of claim 11, wherein said photohardening agent is present in an amount of about 1 to 1,000 parts by weight per part by weight leuco dye.

15. The photosensitive element of claim 8, wherein said photosensitive composition is coated on said support in a thickness of about 0.5 to 10 microns.

16. The photosensitive element of claim 8 additionally comprising a filter layer or an antihalation layer.

17. The photosensitive composition of claim 1, wherein said leuco dye is a triphenylmethane or xanthene.

18. The photosensitive element of claim 8, wherein said leuco dye is a triphenylmethane or xanthene.

19. The photosensitive composition of claim 4, wherein said photohardening agent is selected from the group consisting of:
(a) polyvinyl cinnamate,
(b) a polyester having a photosensitive group in the main chain,
(c) an azide polymer, and
(d) a photopolymerizable composition comprising an ethylenically unsaturated compound, an initiator and a binder.

20. The photosensitive element of claim 11, wherein said photohardening agent is selected from the group consisting of:
(a) polyvinyl cinnamate,
(b) a polyester having a photosensitive group in the main chain,
(c) an azide polymer, and
(d) a photopolymerizable composition comprising an ethylenically unsaturated compound, an initiator and a binder.

21. The photosensitive composition of claim 19, wherein said polyester having a photosensitive group in the main chain is a polyester of a polyhydric alcohol and a polycarboxylic acid, said polyester being soluble in an organic solvent and containing as an essential recurring integral portion a

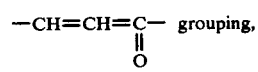 grouping, said grouping being attached through the —CH=CH— end to an aromatic nucleus and through the

end to a member selected from the group consisting of aromatic nuclei, o-alkylene radicals and amido nitrogen.